United States Patent [19]

Brogardh et al.

[11] 4,378,496

[45] Mar. 29, 1983

[54] CURRENT MEASURING APPARATUS USING LIGHT-EMITTING DEVICES

[75] Inventors: Torgny Brogardh; Olof Engstrom; Christer Ovrén; Lars Sander, all of Västerås, Sweden

[73] Assignee: Asea Aktiebolag, Västerås, Sweden

[21] Appl. No.: 199,446

[22] Filed: Oct. 22, 1980

[30] Foreign Application Priority Data

Oct. 29, 1979 [SE] Sweden ............................ 7908914

[51] Int. Cl.³ .............................................. G02B 5/14
[52] U.S. Cl. .................................. 250/227; 250/231 R
[58] Field of Search ........................... 250/227, 231 R

[56] References Cited

U.S. PATENT DOCUMENTS 3,244,894 4/1966 Steele et al.
3,327,124 6/1967 Plum.
4,041,308 8/1977 Fujita.

OTHER PUBLICATIONS

"Dual-Wavelength Demultiplexing InGaAsP Photodiode," Campbell et al., Appl. Phys. Lett. 34(6), Mar. 15, 1979.

Primary Examiner—David C. Nelms
Assistant Examiner—Darwin R. Hostetter
Attorney, Agent, or Firm—Watson, Cole, Grindle & Watson

[57] ABSTRACT

The invention relates to a device for measuring current which traverses a light-emitting structure, the current passage thus causing emission of light. It is characterized in that the emitted light signal is adapted to be supplied to two photo-detectors having different sensitivity spectra and/or with at least one photo-detector being provided with an optical filter. The output signals of the photo-detectors are adapted to be supplied to a quotient forming member and/or a calculating member for obtaining a signal which is compensated for temperature variations in the light-emitting structure and other sources of error.

28 Claims, 13 Drawing Figures

CURRENT MEASURING APPARATUS USING LIGHT-EMITTING DEVICES

BACKGROUND

1. Field of the Invention

The present invention relates to a device for measuring current which traverses a light-emitting structure, such as a light-emitting diode.

Current measurement at a high potential often constitutes a problem and at present requires expensive and complicated equipment. Equipment is required that is capable of operating at a high potential and of sending measurement values to ground potential. For example in case of high-voltage, direct current transmission, measuring devices having such capabilities are very expensive. At such currents, the operating instruments have to be provided with an insulation that corresponds to the potential of the conductor where the current is measured. This results in constructional problems, for example in current transformers for high voltage levels.

2. Prior Art

It is previously known to use two photo-sensitive elements which are sensitive to different light frequency bands, to radiation detection (U.S. Pat. No. 3,244,894) in which optical fiber bundles are used so that the photosensitive elements are located at some distance away from the location of the measurement.

SUMMARY OF THE INVENTION

Our invention is a modification of the above-mentioned technique and provides a solution to the above-mentioned problems and other problems associated therewith. The emitted light signal is adapted to be supplied to two photo-detectors via at least one optical fiber, with the photo-detectors having different sensitivity spectra with respect to the wavelength of the incident light. At least one of the photo-detectors is connected to an optical filter, and the measuring device includes one additional light-emitting structure (reference structure), the output signal of which is modulated by a frequency other than the first-mentioned light-emitting structure, or which is time-multiplexed by the other frequency. In this way, a device is obtained that provides relatively reliable measurement values at ground potential without using expensive equipment for insulation at the high measurement potential.

In a preferred embodiment at least one of the photodiode detectors is connected to an optical filter.

In another embodiment at least one of the photodetectors is arranged in optical contact with a photoluminescent material. In a further embodiment the emitted light signal is supplied to an integrated wavelength-demultiplexed structure, for example designed so that light signals traverse two pn junctions made in a material having different band gaps. (See Appl. Phys. Lett. 34, 401, 1979.)

The output signals obtained from the photo-detectors are suitably supplied to a quotient forming circuit to obtain a signal which is compensated for intensity variations arising because of temperature variations in the light-emitting structure or because of other error sources.

In a first preferred embodiment the photo-diode detector consists of at least one semiconductor containing silicon or any other high current semiconductor, to which there is connected at least one optical fiber arranged to take up the luminescent radiation that is emitted upon recombination between electrons and holes in the volume of the crystal and which radiation constitutes a measure of current passing through the semiconductor. When measuring currents at a high voltage level, current transformers are used to the greatest possible extent to insulate the measurement system from the high potential of the quantity to be measured. By the embodiment proposed, an optical method is provided which in a simple manner solves the problem of electrically insulating the measurement system from the quantity to be measured.

In a preferred embodiment, the light-emitting structure consists of a light-emitting diode (LED), traversed by current, for example connected to a current transformer, possibly connected in anti-parallel relationship with another diode, whereby the light signal received and transmitted by the optical fiber is a measure of the current. Thus, this embodiment provides a number of possibilities of utilizing electroluminescence for optical measurement of current. The quantity that is measured is the intensity of the light emitted from an LED when it is traversed by an electric current. The light intensity is therefore a reliable measure of the current passing through the LED, and this device can be connected to a current transformer. In this way a current may be measured at a high potential without the current transformer having to be provided with insulation corresponding to the potential of the conductor in which the current is measured. Current transformers can therefore be insulated in the same way independently of the voltage level, which results in considerably cheaper constructions for high voltage levels.

A problem in connection with measurement of the light intensity from the LED is that the light intensity emitted for a certain current is dependent on the temperature of the semiconductor crystal of the diode, but this can be solved in accordance with the embodiments described below.

BRIEF DESCRIPTION OF THE DRAWINGS

The invention is exemplified in greater detail in the accompanying drawings, wherein.

DETAILED DESCRIPTION

The principles of measurement described below are based on spectral division of the light that is emitted from a solid material when traversed by an electric current. A suitable component for this may be a pn junction of GaAs, GaP, GaAlAs, GaAsP or Si, or Schottky diodes of, for example, CdS, CdSe, ZnSe. In the following description and in the claims, the term "light" refers to electromagnetic radiation within the wavelength range 0.1 to 10 μm.

Figure 1:
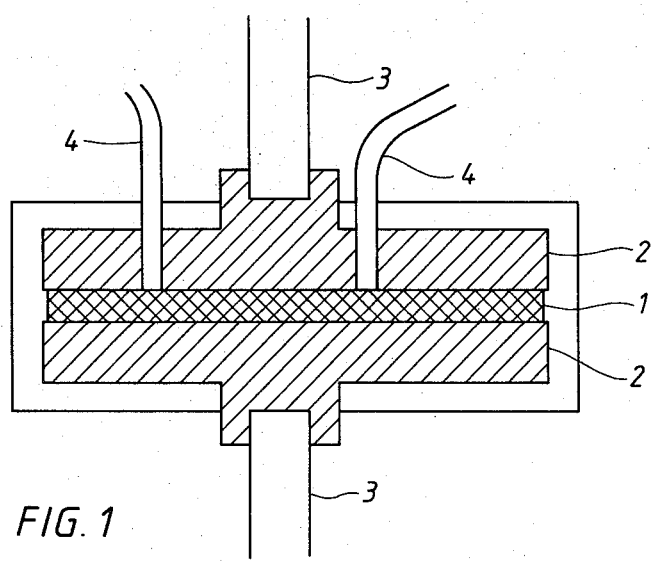
FIG. 1 shows a semiconductor for high currents to which optical fibers are connected.

FIG. 1 shows an embodiment of the light-emitting element, in which semiconducting crystal plate 1 is attached between two round metal plates 2 which are electrically connected to current carrying conductor 3. Optical fibers 4 are in optical contact with semiconductor crystal 1 and receive the light which is emitted when the current from conductor 3 passes through crystal plate 1.

Figure 2:
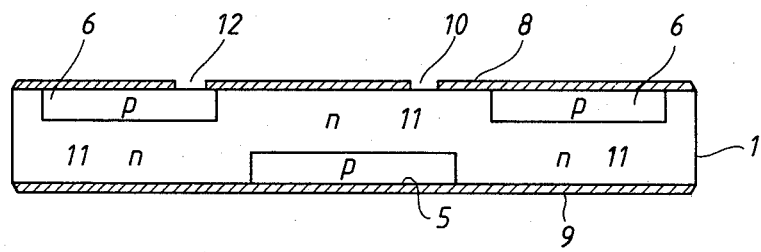
FIG. 2 shows the shape of the semiconductor crystal in a device according to FIG. 1.

FIG. 2 shows the shape of the semiconductor crystal, which is designed as an integrated anti-parallel structure so that it may be used in connection with alternating current as well, that is, so that it may measure during both half-cycles of the AC current. For the current passing through the crystal to give rise to light emission, the current has to be carried by electrons as well as by holes, so that recombination may take place between these particles. This recombination takes place by giving off energy in the form of photons, either in such a way that an electron in the conduction band of the semiconductor is directly joined to a hole in its valence band, or in such a way that the recombination takes place via one or more energy levels in the band gap of the semiconductor. In order that injection of both electrons and holes may take place in an efficient manner, the semiconductor crystal has to be provided with one or more pn junctions. When measuring alternating current, these pn junctions are located in such a configuration that the semiconductor crystal carries current in both directions.

In the embodiment according to FIG. 2, semiconductor 1 of n type is shown which has been provided with p type regions 5 and 6, which may alternately inject holes in n type region 11, depending on the direction of the applied voltage. Ohmic metal contacts 8 and 9 are applied to the surfaces of the semiconductors where the current is injected. When the voltage is applied with a positive potential to contact 8, holes will be injected from p type region 6 into n type region 11, whereas electrons are injected from contact 9 into n type region 11 and further into p type region 6. These particles recombine and emit light which may be detected through opening 12 in metal contact 8. When the voltage is applied with a positive potential to contact 9, holes will be injected from p type region 5 into n type region 11, whereas electrons are injected from contact 8 into n type region 11 and further into p type region 5. In the same way as before, light will be emitted, which may be detected through opening 10 in metal contact 8. The structure, as it is shown in FIG. 2, is intended to be used for measuring alternating current. It must then be designed with two antiparallel-connected pn junctions 6, 11 and 5, 11, respectively. When measuring direct current, a structure consisting only of one pn junction is used, designed as the central portion 5, 11 with the fiber in FIG. 2. The structure in FIG. 2 may also be constructed inversely, so that a p type semiconductor is the starting-point, which is then provided with n regions in the same configuration as the p regions in FIG. 2. Diodes of this kind may be manufactured from silicon using known technology. This means that the conducting area may be made very large, which permits measurements of high currents.

All possible light-emitting structures will be designated "LED" in the following description. The emitted light from the LED is passed into the optical fiber, which is connected to one or more photo-detectors, which may be provided with optical filters. The current which is generated in the photo-detector may be described as follows.

It is assumed that the LED emits a spectrum of $\alpha(h\nu)$, where $h\nu$ is photon energy. The transmission spectrum of the optical filter is $\tau(h\nu)$. The photo-detector generates an electric current, which is a function of the photon energy of the incident light. The spectral response of the photo-detector is described by a function $\chi(h\nu)$. The current $\phi$ from the photo-detector for a certain emitted spectrum from the LED and a certain filter may then be expressed by the integral $\phi = \int \alpha(h\nu)\tau(h\nu)\chi(h\nu)\, d(h\nu)$.

To facilitate the description in the following, $\chi(h\nu)$ will be omitted from all expressions. This may be justified by the fact that a photo-detector where $\chi(h\nu)=a$ constant is used, a so-called grey photo-detector, or that $\chi(h\nu)$ is incorporated in the function for the emitted spectrum $\alpha(h\nu)$.

Figure 3:
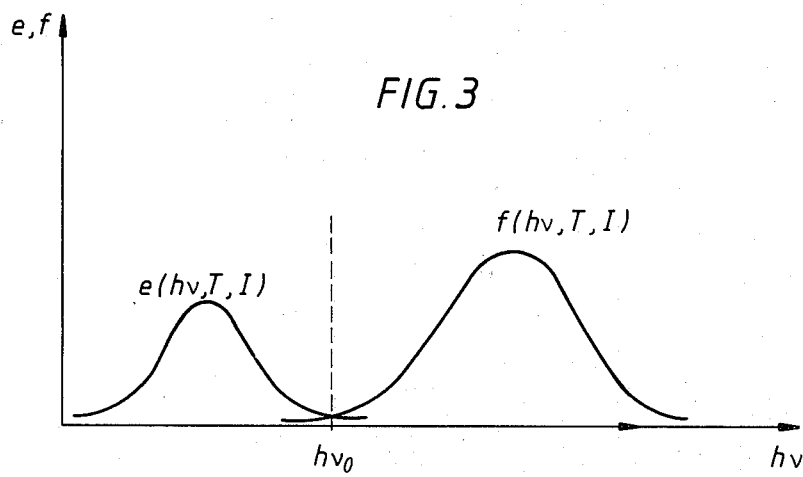
FIG. 3 shows emission spectra from two LEDs.

FIG. 3 shows the characteristics of two LEDs having different emission spectra, namely $e(h\nu, T, I)$ and $f(h\nu, T, I)$. It is assumed that the diodes are series-connected so as to be traversed by the same current I, and that they are mounted in such a way as to have the same temperature T. If these spectra are separated at $h\nu_0$ with the aid of edge filters, the measured intensity of two grey detectors will be:

$$\phi_1(T, I) = \int_{-\infty}^{h\nu_O} e(h\nu, T, I)\, d(h\nu) \quad (1)$$

$$\phi_2(T, I) = \int_{h\nu_O}^{\infty} f(h\nu, T, I)\, d(h\nu) \quad (2)$$

Figures 4A, 4B:
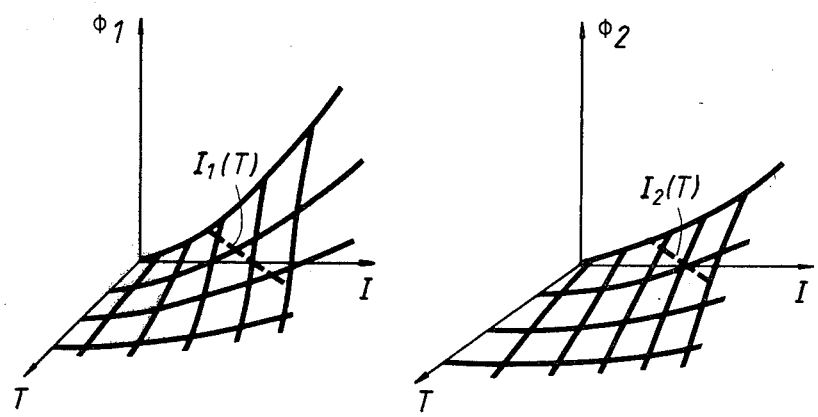
FIGS. 4a and 4b show the measured intensity from two photo-detectors.
Figure 5:
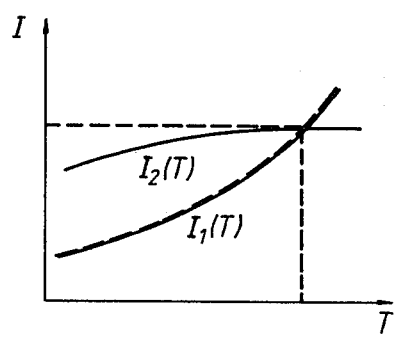
FIG. 5 shows a diagram for determining temperature.
Figure 6:
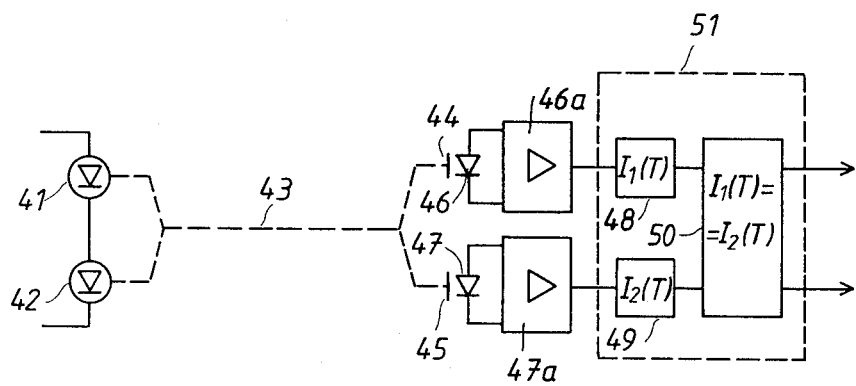
FIG. 6 shows a block diagram for an embodiment according to the invention.

The functions $\phi_1$ and $\phi_2$ are respectively illustrated in FIGS. 4a and 4b. Each measured value of the intensities $\phi_1$ and $\phi_2$ corresponds to a function $I_1(T)$ and $I_2(T)$, respectively, in the IT plane. With knowledge of the functions $I_1$ and $I_2$, the temperature of the diodes may be determined by solving equations (1) and (2) according to FIG. 5, that is, where $I_1(T)=I_2(T)$. A block diagram of one way of applying this is is shown in FIG. 6. LEDs 41 and 42 emit light into two optical fibers, which are joined into fiber 43. Fiber 43 is then branched and is connected to photo-detectors 46 and 47, each of which is provided with edge filter 44 and 45, respectively. The transmission spectra of the edge filters, which are mutually different, are clear from FIG. 7. After amplification of the electric signals from photo-detectors 46, 47 by amplifiers 46a, 47a the amplified signals are fed into computer 51, which determines the functions $I_1(T)$ and $I_2(T)$ and which also solves equations (1) and (2) for the condition $I_1(T)=I_2(T)$. The temperature and current (TI) of LEDs 41 and 42 are thus obtained from computer 51. The internal values are calculated by calculating units 48 and 49 and the output signals I and T therefrom are put together in unit 50 within computer 51.

If the spectrum from an LED has different dependences on I and T for different values of $h\nu$, different parts of the spectrum may be filtered out and be processed in the same way as the spectra from two different LEDs. It is assumed that an LED has the spectrum g(hν, T, I) according to FIG. 7 and that the T and I dependence of g is different for hν<hν₀ and hν>hν₀, respectively. By utilizing edge filters 44 and 45, respectively, two functions $\phi_1$ and $\phi_2$ may then be obtained according to the following:

$$\phi_1(T, I) = \int_{-\infty}^{h\nu_O} g(h\nu, T, I) d(h\nu) \quad (4)$$

$$\phi_2(T, I) = \int_{h\nu_O}^{\infty} g(h\nu, T, I) d(h\nu) \quad (5)$$

This can be detected by the aid of the photodetector. The system will have the same appearance as the previous FIG. 6 with the difference that only one LED is employed in this case.

The measured intensity $\phi$ in the equations (1)–(5) is a function of current and temperature. We will now consider the case where $\phi$ may be separated into a product of two functions $\varphi$ and $\epsilon$ according to $$\phi(T, I) = \epsilon(T) \cdot \varphi(I) \quad (6)$$

Figure 7:
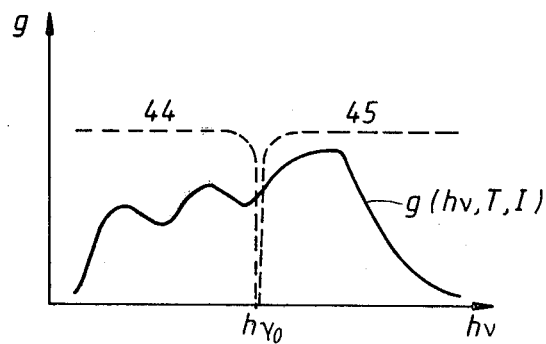
FIG. 7 shows a spectrum for an LED.

In the same way as described previously, two parts of a spectrum may then be separated out as indicated by equations (4)–(5) by means of two edge filters 44 and 45 (FIG. 7). Two functions $\phi_1$ and $\phi_2$ are then obtained, each one capable of being separated according to equation (6). Two cases may be considered:

(a) The integral of the spectrum has uniform temperature dependence so that $$\phi_1(T, I) = A \cdot \epsilon(T) \cdot \varphi_1(I) \quad (7)$$

$$\phi_2(T, I) = B \cdot \epsilon(T) \cdot \varphi_2(I) \quad (8)$$

(b) The integral of the spectrum has uniform current dependence so that $$\phi_1(T, I) = A \cdot \varphi(I) \cdot \epsilon_1(T) \quad (9)$$

$$\phi_2(T, I) = B \cdot \varphi(I) \cdot \epsilon_2(T) \quad (10)$$

If the integral of the spectrum has uniform temperature dependence, a measure of the current will be obtained by performing a division between equations (7) and (8):

$$\frac{\phi_1}{\phi_2} = \frac{A}{B} \cdot \frac{\varphi_1(I)}{\varphi_2(I)} \quad (11)$$

Figure 8:
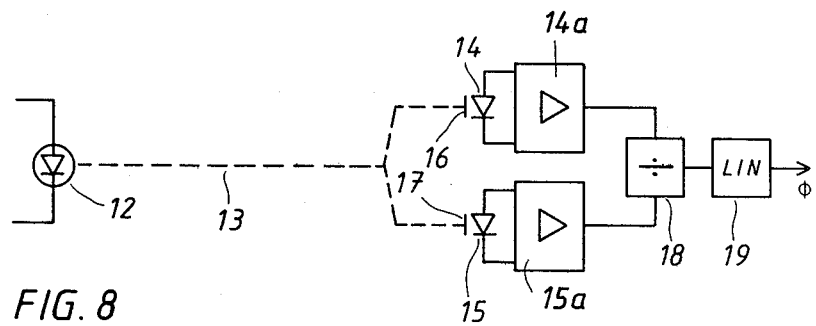
FIG. 8 shows a system for performing division.

A system for obtaining this is shown in the block diagram of FIG. 8. LED 12 emits light into fiber 13, which is branched off so that the light hits photo-detectors 14 and 15, which are each provided with an edge filter 16 and 17. The electric signals then obtained are amplified by amplifiers 14a and 15a and the quotient therebetween is formed by divider circuit 18, the output signal of which is a non-linear measure of the current. That output signal is linearized in unit 19, which provides an output signal $\phi$ proportional to the current in the diode.

If the integral of the spectrum has uniform current dependence, a measure of the temperature of the diode will be obtained by performing a division between equations (9) and (10):

$$\frac{\phi_2}{\phi_1} = \frac{A}{B} \cdot \frac{\epsilon_1(T)}{\epsilon_2(T)} \quad (12)$$

The temperature of the diode 12 is thus obtained from the quotient $\phi_2/\phi_1$, whereas its current is obtained by measuring $\phi_1$ or $\phi_2$ and by compensating for the temperature dependence of these parameters when the temperature is known.

Figure 9:
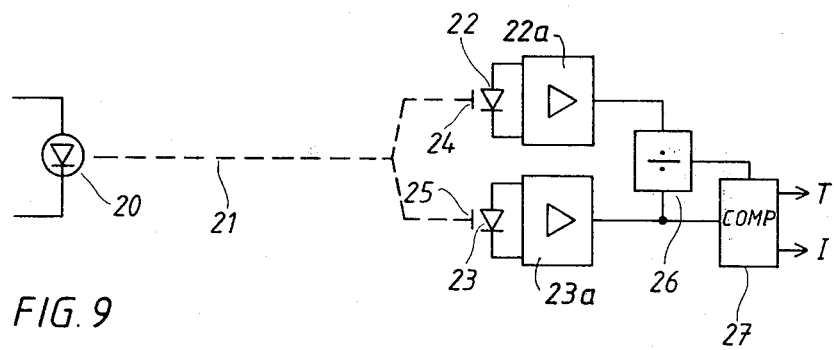
FIG. 9 shows a system for current measurement.

A system for measuring current by the above-mentioned method is shown in FIG. 9. LED 20 emits light into fiber 21, which is branched off so that the light hits photodetectors 22 and 23, which are each provided with edge filter 24 and 25, respectively. The electric signals then obtained are amplified by amplifiers 22a and 23a and the quotient therebetween is formed by divider circuit 26. With this information, temperature and current values may be calculated in computer 27.

In the foregoing, a number of spectra have been described, and these may be classified as follows, depending on the signal processing method:

A. Arbitrary spectra from one or two LEDs.
B. Separable spectra, the integral of which has uniform temperature dependence for different photon energies.
C. Separable spectra, the integral of which has uniform current dependence for different photon energies.

In case A, arbitrary light-emitting structures may be used, such as pn junctions of Si, GaAs, GaAlAs, GaP, GaAsP or Schottky diodes of ZnSe, CdS or CdSe.

Spectra of type B are obtained from (Zn,O) and (Cd,O) doped GaP diodes, or from GaAs diodes with recombination processes of band-band type and impurity type occurring at the same time.

Spectra of type C occur at pn junctions of float-zone drawn n type GaAs having electron concentrations in the region $10^{16}$ $cm^{-3}$, where the n region has been formed by indiffusion of Zn.

Figure 10:
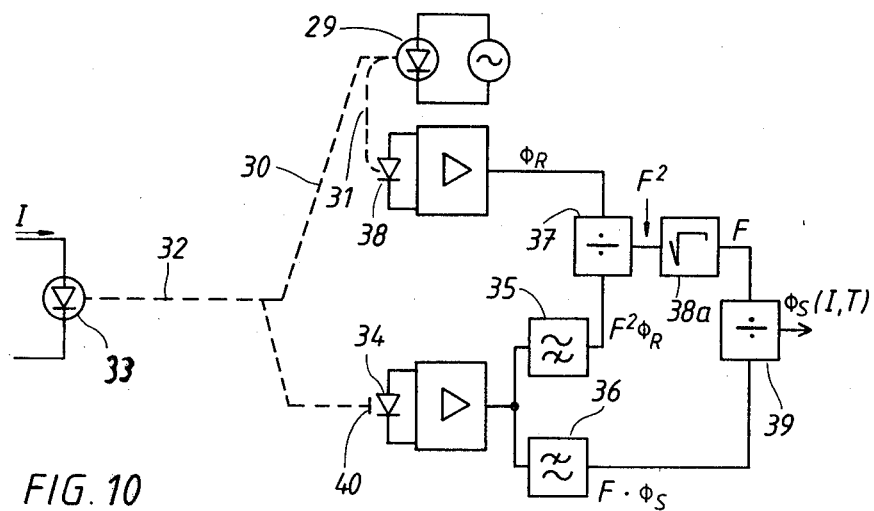
FIG. 10 shows an alternative embodiment of the current measurement system of FIG. 9.

When bending the optical fiber, a change in the intensity of the transmitted light occurs, for which some form of compensation has to be carried out. Such compensation has to be carried out for spectrums of type A and type C. For spectra of type B, such compensation is not necessary, since in this case the current is measured as the quotient between two current-dependent quantities which are influenced in the same manner by changes in the bending of the fiber. A method for compensating for fiber bendings in case of A and C spectra is illustrated in FIG. 10.

LED 29 delivers a reference signal into fibers 30 and 31. The signal has a certain frequency which deviates from the frequency of the measuring signal of LED 33. The signal from LED 29 which is fed into fiber 30 is transmitted through fiber 32 and is reflected against the end thereof, which is coated with a partially reflecting layer, close to LED 33. After the reflection the reference signal together with the measuring signal from LED 33 pass through fiber 32 and impinge upon photodetector 34 which is provided with filter 40. The electric signal from photo-detector 34 is divided into a measuring signal and a reference signal by the action of two electric filters 35 and 36. The reference signal passes through filter 35 and is input to divider circuit 37. The damping in the fiber optical system is dominated by fiber 32, since this has the greatest length of all fiber branches. The reference signal from diode 29 passes through fiber 32 twice and is therefore influenced quadratically by the damping factor thereof. Photo-detector 38, which is connected to LED 29 by a very short fiber 31, delivers an electric signal which is not influenced by the bending of fiber 32. Divider circuit 37 has input signal $F^2\phi_R$ from filter 35 as well as signal $\phi_R$ from photo-detector 38. By root extraction at root extractor circuit 38a, signal F is obtained which is a measure of the damping of fiber 32. Signal F $\phi_s$ is obtained from filter 36, which signal is divided by divider circuit 39 by the damping factor F, thus obtaining measuring signal $\phi_s$. The latter signal is freed from the effect of the fiber bending and may be processed in a manner previously described in dependence on the property of the spectrum of LED 33.

Figure 11:
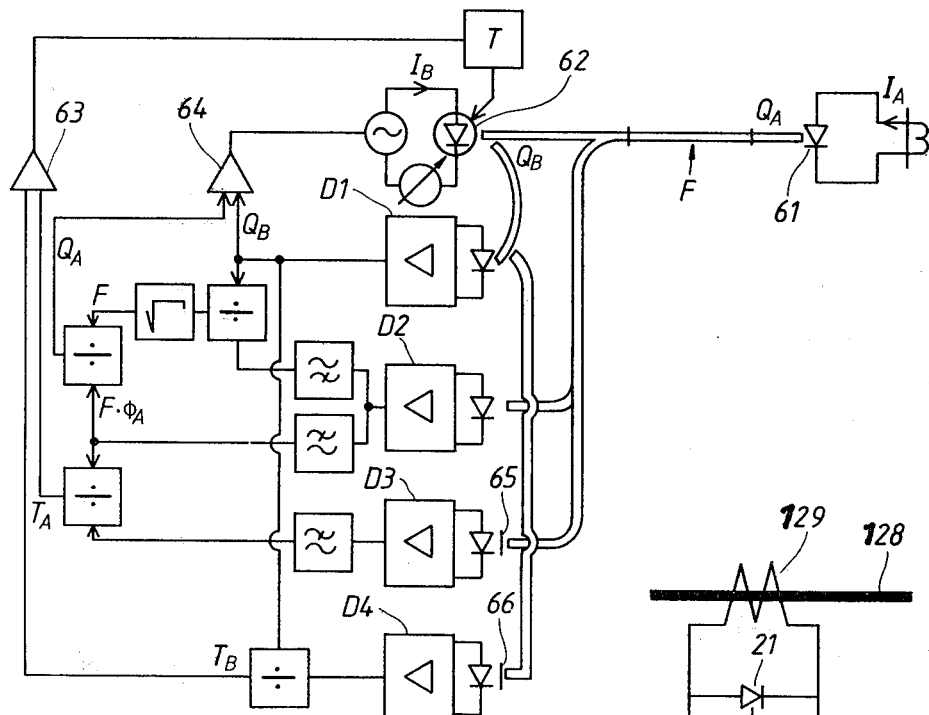
FIG. 11 shows a system for comparative measurement of current.

A system for measuring current by a comparative method is illustrated in FIG. 11. The system is built up around two LEDs 61 and 62 having identical properties. The temperature and the current for LED 62 may be controlled by means of regulating systems 63 and 64. Optical signals are detected in four detector systems D1–D4, two of them being provided with filters 65, 66 for dividing the spectrum into different wavelength intervals. From the above description it is clear how this enables determination of temperature as well as of current. The optical signal from LED 61 is amplitude-modulated by frequency $f_A$, which is determined by the frequency of current $I_A$ which is to be measured. The optical signal from LED 62 is amplitude-modulated by frequency $f_B$ which is chosen so that the output signal from the photo-detector systems may be divided into contributions with frequency $f_A$ and frequency $f_B$ by electric filtering. The damping factor F is assumed to be caused by damping of the central part of the fiber system, which is marked in the Figure. By forming the quotient of signals according to FIG. 11, signals proportional to $T_A$ and $T_B$ may be supplied to regulating circuit 63, and signals proportional to $\phi_A$ and $\phi_B$, i.e. light flux from LEDs 61 and 62, may be supplied to regulating system 64. The regulating systems operate in such a way that $T_A = T_B$ and $\phi_A = \phi_B$. $I_B$ and $T_B$ are measured in the reference systems and are thus obtained independently of factor F.

Figure 12:
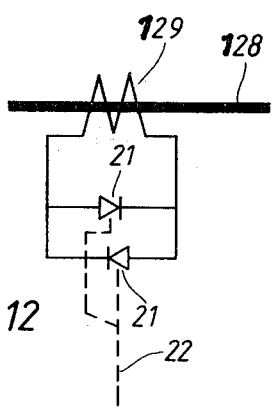
FIG. 12 shows an antiparallel connection of two-photo-diodes.

The transformation from current into light in current transformer 129 may take place in several ways. To be able to measure the current through conductor 128 during the two half-cycles, two LEDs 21 may be connected in antiparallel as shown in FIG. 12. LEDs 21 may be mounted on the same case and their emitted light intensity may be detected with one or two fiber ends in the manner shown in FIG. 12. A further possibility is to integrate two antiparallelly-connected LEDs in the same semiconductor crystal, the light intensity of the LEDs thus being detected with the same fiber end. This may be carried out in principle in the same way as was shown in connection with the device according to FIG. 2.

The devices according to the above may be varied in many ways within the scope of the following claims.

What is claimed is:

1. A device for measuring current comprising:
   electroluminescence means for generating light within first and second dissimilar wavelength intervals in response to stimulation by said current such that said electroluminescence means is modulated by said current;
   said electroluminescence means further comprising a material compositionally formed and dimensioned such that said light exhibits a plurality of non-uniform current dependencies;
   at least one optical fiber optically connected to said electroluminescence means;
   first and second photo-detectors each optically connected to said at least one optical fiber and respectively having first and second sensitivity spectra and respectively adjusted to said first and second wavelength intervals such that said first photo-detector selectively senses said light in at least a portion of said first wavelength interval and said second photo-detector senses said light in at least a portion of said second wavelength interval.

2. A device as claimed in claim 1 wherein said electroluminescence means further comprises at least one diode.

3. A device as claimed in claim 1 wherein said material further comprises a doped semiconductor material including a plurality of light emitting structures containing a doping material, said doped semiconductor material having band to band junctions and having charge carriers injected therein by said current so as to recombine said charge carriers via said band to band junctions and via said light emitting structures.

4. A device as claimed in claim 1 wherein said electroluminescence means further comprises first and second material junctions electrically connected in series with said current, said first material junction having a first material composition and said second material junction having a second material composition different from said first material composition so as to generate dissimilar electroluminescent spectra within said first and second dissimilar wavelength intervals.

5. A device as claimed in claim 4 wherein said first and second material junctions further comprise pn junctions.

6. A device as claimed in claim 4 wherein said first and second material junctions further comprise Schottky junctions.

7. A device as claimed in claim 4 wherein said first material composition comprises first doping means and said second material composition comprises second doping means different from said first doping means so as to generate said dissimilar electroluminescent spectra.

8. A device as claimed in claim 16 wherein said first and second material junctions further comprise metal insulator semiconductor junctions.

9. A device as claimed in claim 4, 5, 6 or 7 wherein said material further comprises a plurality of charge carriers injected in said first and second material junctions by said current and recombining in said material.

10. A device as claimed in claim 1 wherein said material further comprises an undoped material.

11. A device as claimed in claim 9 wherein said material further comprises (Zn, O) doped material.

12. A device as claimed in claim 9 wherein said material further comprises (Cd, O) doped material.

13. A device as claimed in claim 9 wherein said material further comprises doped GaP material.

14. A device as claimed in claim 1 wherein said plurality of non-uniform current dependencies further comprises band to band type recombination current dependencies.

15. A device as claimed in claim 1 wherein said plurality of non-uniform current dependencies further comprises impurity type recombination current dependencies.

16. A device as claimed in claims 14 or 15 wherein said material further comprises GaAs.

17. A device as claimed in claim 13 further comprising:
means for dividing an output of said first photo-detector by an output of said second photo-detector and for producing a corresponding divided output; and
means for generating an output signal representative of said current from said divided output of said means for dividing wherein said output signal is compensated for intensity variations unrelated to said current in said light generated by said electroluminescence means.

18. A current measuring device, comprising:
means for generating light in response to stimulus by the current to be measured and being modulated thereby;
at least two photo-detectors for detecting the light generated by said generating means, said at least two photo-detectors having different spectral sensitivity characteristics with respect to the wavelength of said light wherein at least one of said at least two photo-detectors optically contacts a photo-luminescence material;
at least one optical fiber for transmitting said light from said generating means to said at least two photo-detectors;
an optical filter for filtering the light transmitted to at least one of said at least two photo-detectors;
means for generating a reference light signal;
means for modulating said reference light generating signal at a frequency different than the modulation frequency of the light generated by said generating means, said at least one optical fiber transmitting the modulated reference signal to said means for generating light;
means for dividing the output of one of said at least two photo-detectors by the output of another of said at least two photo-detectors; and
means for generating an output signal representative of the current to be measured from the output of said means for dividing, said output signal being compensated for intensity variations unrelated to said current in said light generated by said generating means.

19. A current measuring device, comprising:
means for generating light in response to stimulus by the current to be measured being modulated thereby;
at least two photo-detectors for detecting the light generated by said generating means, said at least two photo-detectors having different spectral sensitivity characteristics with respect to the wavelength of said light, wherein at least one of said at least two photo-detectors is in optical contact with a photo-luminescent material and includes two pn junctions made of material with different band gaps such that the emitted light signal traverses said two pn junctions;
at least one optical fiber for transmitting said light from said generating means to said at least two photo-detectors;
an optical filter for filtering the light transmitted to at least one of said at least two photo-detectors;
means for generating a reference light signal;
means for modulating said reference light generating signal at a frequency different than the modulation frequency of the light generated by said generating means, said at least one optical fiber transmitting the modulated reference signal to said means for generating light;
means for dividing the output of one of said at least two photo-detectors by the output of another of said at least two photo-detectors; and
means for generating an output signal representative of the current to be measured from the output of said means for dividing, said output signal being compensated for intensity variations unrelated to said current in said light generated by said generating means.

20. A current measuring device as in claim 19, wherein said means for generating light is a semiconductor diode.

21. A current measuring device as in claim 19, wherein said means for generating light is a semiconductor laser.

22. A current measuring device as in claim 19, wherein said means for generating light is a Schottky diode.

23. A current measuring device as in claim 19, wherein said means for generating light is a metal insulator semiconductor.

24. A current measuring device as in claim 19, wherein said means for generating light consists of two light emitting elements connected in series with one another.

25. A current measuring device as in claim 19, wherein said means for generating light is two light emitting elements connected in anti-parallel relationship and including a current transformer connected to the current to be measured.

26. A current measuring device as in claim 19, wherein said means for generating light is a semiconductor crystal doped such that two opposed sides have intersecting surfaces with both n type and p type conducting materials.

27. A current measuring device as in claim 25, wherein said reference light signal is transmitted to at least one of said at least two photo-detectors and the output signal thereof is input to said means for dividing.

28. A current measuring device as in claim 19 further comprising means for regulating the current and temperature of said means for generating a reference light signal.

* * * * *